United States Patent [19]

Martin

[11] 4,202,476
[45] May 13, 1980

[54] WEB TENSIONING APPARATUS FOR A HOSTILE FLUID BATH

[76] Inventor: John R. Martin, c/o Martin Automatics Inc., 1661 Northbrook Ct., Rockford, Ill. 61103

[21] Appl. No.: 972,256

[22] Filed: Dec. 22, 1978

[51] Int. Cl.² .................. B65H 17/42; B65H 17/22; B65H 23/16
[52] U.S. Cl. .................................. 226/119; 226/189; 242/75.3
[58] Field of Search ............... 226/119, 111, 189, 188, 226/195; 242/75, 75.3, 75.4, 67.3 R, 55.01

[56] References Cited
U.S. PATENT DOCUMENTS

| | | | |
|---|---|---|---|
| 2,781,192 | 2/1957 | Gilfillan | 226/119 X |
| 2,793,033 | 5/1957 | Seelen | 226/119 |
| 3,643,844 | 2/1972 | Hunter | 226/119 |

Primary Examiner—Edward J. McCarthy
Attorney, Agent, or Firm—Allegretti, Newitt, Witcoff & McAndrews

[57] ABSTRACT

A web tensioning apparatus for a hostile fluid bath is disclosed. Web-driving rollers of the apparatus are fixed above the bath, and idler rollers are suspended from the web within the bath. A first drive sets the surface velocity of a first web-driving roller, and second drives set the surface velocities of the other web-driving rollers, in response to the positions of the idler rollers. Substantially uniform web tension is thereby maintained.

8 Claims, 4 Drawing Figures

U.S. Patent    May 13, 1980    4,202,476
FIG. 1
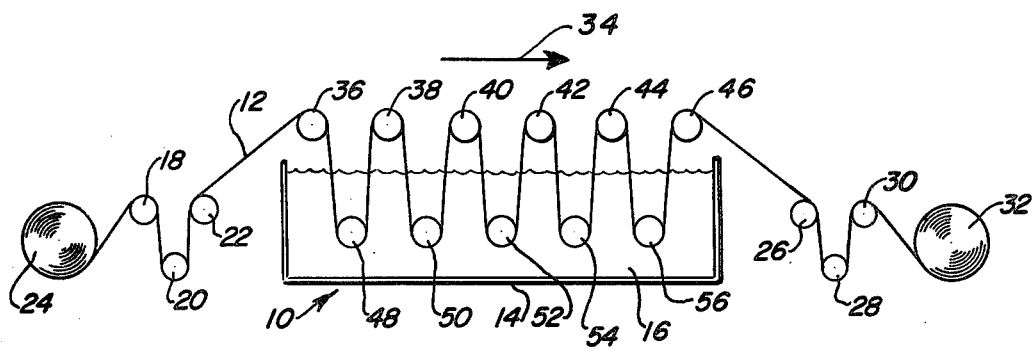
FIG. 2
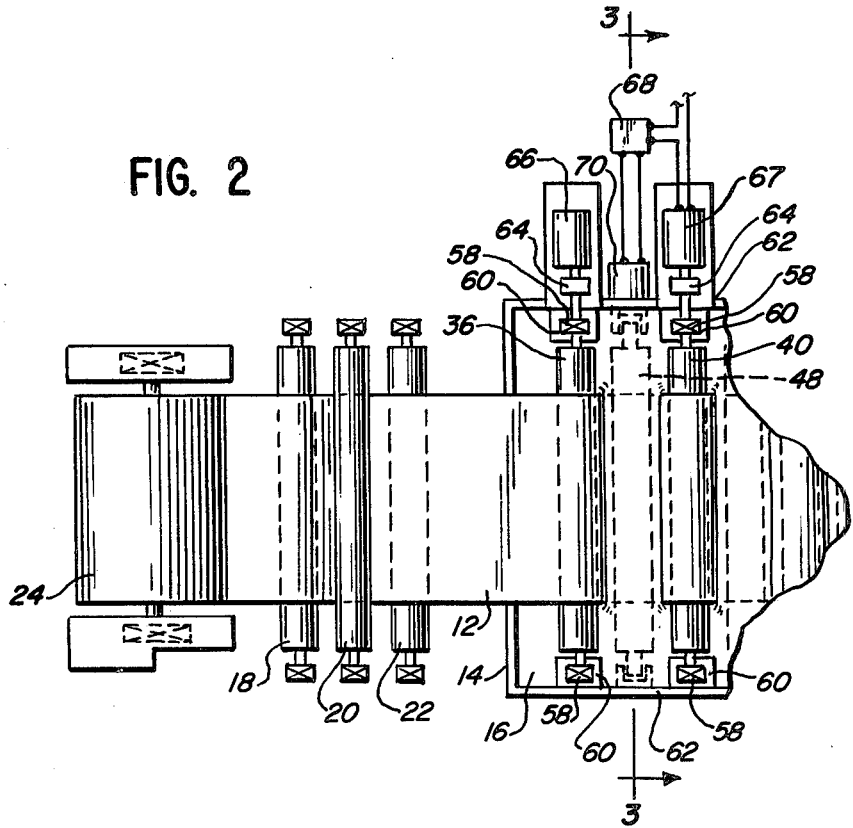
FIG. 3
FIG. 4

WEB TENSIONING APPARATUS FOR A HOSTILE FLUID BATH

BACKGROUND OF THE INVENTION

This invention relates to web tensioning apparatus, and more particularly to web tensioning apparatus for maintaining the tension in a web traveling through a hostile fluid bath.

In the processing of a continuous web formed of material, such as flexible printed circuit board material, it is often necessary to pass the web through a hostile fluid bath such as an etching or plating bath. Conventionally, the web is passed alternately between two series of spaced, parallel rollers that are mounted for rotation upon fixed bearings, one series being located in the bath itself and the other series between located above the bath. The series above the bath are machined to a high degree of identity and driven from a common mechanical power source so as to have substantially identical surface velocities. The series within the bath are idled. Associated with this arrangement, however, are a number of significant problems. First, uncontrollable tension increases and decreases occur in the web, because of the cumulative effect of minute differences in the surface speeds of the rollers. As a result, the web may be damaged or broken. If the web breaks, all processing equipment must be stopped until the web is guided back through the equipment. Second, accurate guidance of the lateral position of the web is made difficult due to the mentioned tension increases and decreases. Gross errors in the lateral position of the web result from the tension increases and decreases, and as a consequence, further damage may be done to the web. Third, because the lower rollers and their bearings operate within the hostile environment of the bath, extraordinary costs must be incurred for bearing repairs and replacements, and for the resultant reduction in operating efficiency.

SUMMARY OF THE INVENTION

In light of the problems described, it is a principal object of the present invention to provide an improved web tensioning apparatus for maintaining the tension of a web traveling through a hostile fluid bath.

Specifically, it is an object of the present invention to provide an improved web tensioning apparatus which overcomes the problem of uncontrollable tension increases and decreases in the web.

Another object of the present invention is to provide an improved web tensioning apparatus which overcomes the difficulty of accurately guiding the lateral position of the web.

Still another object of the present invention is to provide an improved web tensioning apparatus that overcomes the problem of the high vulnerability of the bearings which are positioned within the hostile environment of the hostile fluid bath.

A still further object of the present invention is to provide an improved web tensioning apparatus that facilitates maintenance and cleaning of the rollers of the apparatus.

These and other objects and advantages are provided by the present invention, which in a principal aspect is a web tensioning apparatus for maintaining the tension of a web passing through a hostile fluid bath. The apparatus comprises at least two rotatable web-driving rollers, first drive means, at least one second drive means, at least one rotatable idler roller, sensing means and control means.

The driving rollers are substantially parallel to each other and spaced transversely to their axes of rotation above the hostile fluid bath. The first drive means, operably connected to one of the web-driving rollers, is for driving the one web-driving roller at a pre-selected surface velocity known as the process velocity. The second drive means is operably connected to the other web-driving rollers and is operable in two modes. In a first mode, the second drive means drives the other web-driving rollers at a surface velocity that is greater than the process velocity. In a second mode, the second drive means drives the other web-driving rollers at a second surface velocity that is less than the process velocity. The second process velocity may be a zero velocity.

The rotatable idler rollers are positioned within the hostile fluid bath, and are generally parallel to the web-driving rollers. The idler rollers are positioned so that the web alternately passes across a web-driving roller and an idler roller. The idler rollers are suspended from the web and are substantially free to move toward and away from the web-driving rollers.

The sensing means and the drive controlling means each perform two functions. First, the sensing means senses whether any idler roller has moved toward the web-driving rollers past a first sensing position and the control means, responsive to the sensing means, places the second drive means into the one mode of said first and second modes which moves the idler roller away from the web-driving rollers. Second, the sensing means senses when the idler roller has moved away from the web-driving rollers past a second sensing position and the control means, again responsive to the sensing means, places the second drive means in the other of the first and second modes.

BRIEF DESCRIPTION OF THE DRAWING

The preferred embodiment of the present invention will be described in relation to the accompanying drawing, wherein:

FIG. 1 is a side elevational view of the web tensioning apparatus of the preferred embodiment of the present invention;

FIG. 2 is a top plan view of the web tensioning apparatus of FIG. 1;

FIG. 3 is an enlarged, broken cross-sectional view of an idler roller of the web tensioning apparatus of FIG. 1, taken along line 3—3 of FIG. 2;

FIG. 4 is a broken, perspective view of an idler roller and idler roller guide of the web tensioning apparatus of FIG. 1.

DETAILED DESCRIPTION OF THE PREFERRED EMBODIMENT

Referring to FIG. 1, the preferred embodiment of the present invention is a web tensioning apparatus shown and generally designated 10. The apparatus 10 maintains the tension in a continuous web 12 traveling through a bath or tank 14 filled with a hostile fluid 16.

As shown in FIG. 1, the web 12 advances from the left of the figure toward the apparatus 10, after passing across rollers 18 and 22 and dancer 20, and unwinding from a wound roll 24. Upon exiting the apparatus 10 to the right as shown in FIG. 1, the web 12 passes across rollers 26 and 30 and dancer 28, and is wound onto a windup roll 32.

The rolls 24 and 32 are horizontally spaced and have rotational axes that are substantially parallel to each other and to the rotational axes of the rollers 18, 22, 26, 30 and the dancers 20, 28. The web 12 thus travels from left to right generally in a horizontal direction, as shown by arrow 34. This horizontal direction is by definition, the "direction of web travel".

As depicted in the accompanying drawing, the apparatus 10 includes top rollers 36, 38, 40, 42, 44, 46, and bottom rollers 48, 50, 52, 54, and 56. The top rollers 36–46 are located above the bath 14, and spaced along the direction of web travel. The bottom rollers are located within the hostile fluid 16 and, in the direction of web travel, each interposes a pair of the top rollers 36–46. The web 12 thus passes over the top of the first top roller 36, under the first bottom roller 48, over the second top roller 38, and over and under the remaining rollers in like manner.

As shown in FIG. 2, each top roller 36–46 is mounted above the level of the hostile fluid 16 in the bath 14 on fixed bearings 58 for rotation about substantially parallel axes. As desired, the bearings 58 may be supported on mounting plates 60 attached to the side walls 62 of the bath 14, or mounted atop an independent support structure (not shown).

Each top roller 36–46 is operably connected, as by a coupling 64, to an individual prime mover. The top roller 36 is connected to a prime mover such as an electric motor 66, and the top rollers 38–46 are each connected to a prime mover such as an electric motor 67. The top rollers 36–46 are thus web-driving rollers. That is, an individual prime mover separately drives each roller 36–46, thereby driving the web 12 across the rollers 36–46.

The bottom rollers 48–56, in contrast, are idler rollers, not driven by prime movers and also not mounted on fixed bearings. As shown in FIG. 2, each roller 48–56 is suspended from the web 12 and is substantially free to move vertically, toward and away from the top rollers 36–46.

In each loop of the web 12, i.e., in each length of web 12 from a top roller to an adjacent top roller, the tension in the web, when the bottom roller is rotating in a steady state condition, substantially equals one half the weight of the bottom roller minus one half the buoyancy force acting on the bottom roller, or, minus one half the weight of the fluid displaced by the bottom roller. Thus, depending upon the relative specific gravities of the fluid 16 and the materials of which the bottom rollers 48–56 are formed, the tension in the web 12 can be pre-selected.

Referring again to FIG. 2, the motor 66 establishes the desired velocity of the web 12, i.e., the process velocity, by driving the first top roller 36 at a fixed surface velocity, pre-selected for the process being conducted. Each other motor 67 is operable in two modes. In a first mode, a motor 67 drives a top roller 38–46 at a first surface velocity greater than the process velocity. In a second mode of operation, a motor 67 drives a top roller 38–46 at a second surface velocity less than the process velocity.

Each of the motors 67 is individually controlled by a control mechanism 68 and a sensor 70. The sensor 70 senses the position of the idler roller which precedes the web-driving roller with which the sensor 70 is associated, to at least determine, first, whether the idler roller has moved toward the web driving rollers 36–46 past a first sensing position, and second, whether the idler roller has moved away from the web driving rollers 36–46 past a second sensing position.

The control mechanisms 68, which may be electrical switches, respond to the sensors 70 and control the operating mode of the motors 67. That is, when a sensor 70 senses movement of the preceding idler roller toward the web-driving rollers 36–46 and past the first sensing position, the associated control mechanism 68 switches its motor 67 to the second or low-velocity mode; when a sensor 70 senses movement away from the web-driving rollers 36–46 and past the second sensing position, the associated control mechanism 68 switches its motor 67 to the first or high-velocity mode. Except for some overshoot, if any, the rollers 48–56 are maintained between the first sensing position and the second sensing position, in substantially constant movement therebetween. By controlling the operating modes of the motors 66, and thus the surface velocities of the top rollers 38–46, in response to the positions of the bottom rollers 48–56, the control mechanisms 68 act to eliminate tension variations in the loops of the web 12 and maintain the tension in the web 12 at a substantially uniform value.

As most preferred, the bath or tank 14 and the bottom rollers 48–56 are formed of non-ferrous materials. A means for creating a magnetic field, such as a permanent magnet 72, is centered within one or both ends of each bottom roller 48–56, as shown with bottom roller 48 in FIG. 3. The magnetic field of the magnet 72 extends through the side wall 62 of the bath 14 and is sensed by the sensor 70, which is a magnetic sensor.

Also as most preferred, the bottom rollers 48–56 are formed substantially of two or more materials, such as materials 74 and 76 shown in FIG. 3. The material 74, which covers substantially the entire surface of the roller 48, is relatively immune to the corrosive action of the hostile fluid 16. The material 76, which is unexposed to the hostile fluid 16, may thus be any desired material. Alternately, the volume occupied by the material 76 may be left with a gas such as air.

The material 74, which may be polypropylene, has a lower specific gravity than the fluid 16. The material 76, in contrast, has a higher specific gravity than the fluid 16. The volumetric ratios of the materials 74 and 76 thus may be pre-selected to provide whatever tension is desired in the web 12, including a tension substantially equal to but greater than zero.

Bottom roller positioning in both the direction of web travel and the axial or lateral direction is established by positioning co-axial roller extensions 78, shown best in FIG. 4, between vertically directed flanges 80. The flanges 80 define a vertically directed slot within which the roller extension 78 loosely fits. Although physical contact may occur between the extensions 78 and the flanges 80, only insignificant wear results, since only insignificant forces exist between the roller extentions 78 and the flanges 80. Alternatively, the bottom rollers 48–56 may have enlarged, radially extending flanges at either end. Bottom roller positioning may thus be dictated by the position of the web 12.

From the foregoing, it should be apparent to those of skill in the art that modifications can be made in the apparatus 10 described above. For example, the motor 66 which establishes the process velocity can be operably connected to any one of the web-driving rollers 36–46. In such a situation, each motor 67 responds to the position of the bottom roller which is adjacent the web-driving roller to which the motor 67 is operably connected, in the direction of the web-driving roller which sets the process velocity. In other words, each motor 67 that is connected to a web-driving roller upstream of the process-velocity-setting web-driving roller responds to the succeeding bottom roller, i.e., the bottom roller which is adjacent on the downstream side, rather than the preceding bottom roller. Further, each motor 67 connected to a web-driving roller upstream of the process-velocity-setting web-driving roller is placed in the first or high velocity mode, rather than the second or low velocity mode, when the succeeding bottom roller moves past the first sensing position, and in the second mode, rather than the first, when the succeeding bottom roller moves past the second sensing position.

As another example, as few as two top rollers and one bottom roller can be included in the web tensioning apparatus, or as many more rollers as desired. As a further example, the top rollers 38–46 can be driven by two single speed motors, with each roller being intermittently connected, as controlled by its control mechanism 68, to one or the other motor.

As a still further example, each sensor 70 can determine not only whether a bottom roller has moved past the sensing positions, but also the distance the bottom roller is away from a pre-selected operating position. Utilizing this sophistication, the top rollers 36–46 can be driven by motors whose velocities are infinitely-adjustable, and the velocities varied in proportion to the distance from the pre-selected operating position.

The foregoing description of the preferred embodiment is thus to be considered as illustrative. All embodiments which come within the scope of the claims are intended to be embraced therein.

What is claimed is:

1. A web tensioning apparatus for maintaining tension in a web as it travels through a fluid bath comprising, in combination:
   at least two rotatable web-driving rollers mounted adjacent the fluid bath, the rotatable web-driving rollers substantially parallel to each other and spaced transversely to their axes of rotation along the fluid bath;
   first drive means, operably connected to one of the rotatable web-driving rollers, for driving the one rotatable web-driving roller at a pre-selected surface velocity;
   at least one second drive means, operably connected to the others of the web-driving rollers, the second drive means operable in a first mode for driving the others of the web-driving rollers at a surface velocity greater than the pre-selected surface velocity and operable in a second mode for driving the others of the web-driving rollers at a surface velocity less than the pre-selected surface velocity;
   at least one rotatable idler roller within the fluid bath, the idler rollers generally parallel to the web-driving rollers and positioned so that the web alternately passes across a web-driving roller and an idler roller, the idler rollers suspended from the web and substantially free to move toward and away from the web driving rollers;
   means for sensing the positions of each of the idler rollers to sense (1) whether any of the idler rollers has moved toward the web-driving rollers past a first sensing position, and (2) whether any of the idler rollers has moved away from the web-driving rollers past a second sensing position; and,
   control means for responding to the sensing means and controlling the mode of the second drive means so that (1) when the sensing means senses that any of the idler rollers has moved toward the web-driving rollers past the first sensing position, the second drive means operably connected to the web-driving roller which is adjacent the idler roller that has moved, in a direction away from the web-driving roller to which said first drive means is operably connected, is placed in the one mode of said first mode and said second mode which moves the idler roller away from the web-driving rollers, and (2) when the sensing means senses that any of the idler rollers has moved away from the web-driving rollers past the second sensing position, the second drive means operably connected to the web-driving roller adjacent the idler roller that has moved away from the web-driving rollers, in a direction away from the web-driving rollers to which the first drive means is operably connected, is placed in the other mode of said first mode and said second mode.

2. A web tensioning apparatus as claimed in claim 1 wherein the one web-driving roller to which said first drive means is operably connected is the first web-driving roller across which said web passes upon entry into said web tensioning apparatus.

3. A web tensioning apparatus as claimed in claim 1 wherein said idler roller is formed of at least two materials, one material of lower specific gravity than the fluid of said hostile fluid bath and the other material of higher specific gravity than the fluid of said hostile fluid bath, said idler roller having said materials in proportion to each other such that said idler roller has a pre-selected specific gravity, the tension in the web thereby being a pre-selected tension.

4. A web tensioning apparatus as claimed in claim 3 wherein one of said materials is substantially immune to said fluid.

5. A web tensioning apparatus as claimed in claim 4 wherein substantially the entire surface of said idler roller is formed of said immune material.

6. A web tensioning apparatus as claimed in claim 5 wherein said immune material is polypropylene.

7. A web tensioning apparatus as claimed in claim 1 wherein said second drive means is operable in said first mode and said second mode for driving said other web-driving roller at a plurality of surface velocities, wherein said sensing means is for sensing the position of said idler roller to determine the distance said idler roller is away from a desired operating position between said sensing positions and wherein the control means is further for placing said second drive means in any of said plurality of speeds, the difference between the surface velocity at which said other web-driving roller is thereby driven and said first or second surface velocities being dependent upon the distance said idler roller is away from said desired operating position.

8. A web tensioning apparatus as claimed in claim 1 including at least three web-driving rollers, at least two idler rollers, at least two second drive means each operably connected to a web driving roller, at least two sensing means each sensing the position of an idler roller, and at least two control means, each responding to a sensing means.

* * * * *